United States Patent
Basol

(10) Patent No.: US 8,207,440 B2
(45) Date of Patent: Jun. 26, 2012

(54) PHOTOVOLTAIC MODULES WITH IMPROVED RELIABILITY

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 828 days.

(21) Appl. No.: 12/189,627

(22) Filed: Aug. 11, 2008

(65) Prior Publication Data
US 2010/0032006 A1   Feb. 11, 2010

(51) Int. Cl.
*H01L 31/042*   (2006.01)
(52) U.S. Cl. ............................ 136/251; 136/259
(58) Field of Classification Search .............. 136/251, 136/259
See application file for complete search history.

(56) References Cited

U.S. PATENT DOCUMENTS

| | | | |
|---|---|---|---|
| 4,590,327 A * | 5/1986 | Nath et al. ............. | 136/256 |
| 4,754,544 A | 7/1988 | Hanak | |
| 5,011,544 A * | 4/1991 | Gaddy et al. ........... | 136/246 |
| 5,228,925 A * | 7/1993 | Nath et al. ............. | 136/251 |
| 5,478,402 A | 12/1995 | Hanoka | |
| 5,728,230 A | 3/1998 | Komori et al. | |
| 7,150,938 B2 | 12/2006 | Munshi et al. | |
| 2003/0041893 A1 * | 3/2003 | Shimakawa et al. ......... | 136/244 |
| 2007/0295388 A1 | 12/2007 | Adriani et al. | |
| 2008/0083449 A1 * | 4/2008 | Cumpston ............... | 136/243 |

FOREIGN PATENT DOCUMENTS

WO   WO 03/050891   6/2003

OTHER PUBLICATIONS

International Search Report issued Oct. 1, 2009 in corresponding PCT/Us09/053265.
Olsen, L., et al., "Barrier Coatings for CIGSS and CdTe Cells", *IEEE*, 2005, pp. 327-330.

* cited by examiner

*Primary Examiner* — Jennifer Michener
*Assistant Examiner* — Miriam Berdichevsky
(74) *Attorney, Agent, or Firm* — Pillsbury Winthrop Shaw Pittman LLP

(57) ABSTRACT

A solar module includes a protective shell with at least two sealed sections formed by moisture barrier sealants. Each sealed section is separated from the adjacent sections and includes at least a portion of a solar cell. In this sectioned configuration, any local defect through the protective shell will only affect the performance of the portions of the solar cells within a particular section that contains this defect and will not affect the portions of the solar cells that are in other sections.

16 Claims, 5 Drawing Sheets

PHOTOVOLTAIC MODULES WITH IMPROVED RELIABILITY

BACKGROUND

1. Field of the Inventions

The aspects and advantages of the present inventions generally relate to apparatus and methods of photovoltaic or solar module design and fabrication and, more particularly, to packaging techniques for solar modules such as solar modules employing thin film solar cells.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for CIGS(S) is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a $Cu(In,Ga,Al)(S,Se,Te)_2$ thin film solar cell is shown in FIG. 1. A photovoltaic cell 10 is fabricated on a substrate 11, such as a sheet of glass, a sheet of metal, an insulating foil or web, or a conductive foil or web. An absorber film 12, which includes a material in the family of $Cu(In,Ga,Al)(S,Se,Te)_2$, is grown over a conductive layer 13 or contact layer, which is previously deposited on the substrate 11 and which acts as the electrical contact to the device. The substrate 11 and the conductive layer 13 form a base 20 on which the absorber film 12 is formed. Various conductive layers comprising Mo, Ta, W, Ti, and their nitrides have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO, CdS/ZnO or CdS/ZnO/ITO stack is formed on the absorber film 12. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side.

There are two different approaches for manufacturing PV modules. In one approach that is applicable to thin film CdTe, amorphous Si and CIGS technologies, the solar cells are deposited or formed on an insulating substrate such as glass that also serves as a front protective sheet or a back protective sheet. In this case the solar cells are electrically interconnected as they are deposited on the substrate. In other words, the solar cells are monolithically integrated on the substrate as they are formed. These modules are monolithically integrated structures. For CdTe thin film technology the substrate is glass which also is the front protective sheet for the monolithically integrated module. In CIGS technology the substrate is glass or polyimide and serves as the back protective sheet for the monolithically integrated module. In monolithically integrated module structures, after the formation of solar cells which are already integrated and interconnected in series on the substrate, an encapsulant is placed over the integrated module structure and a protective sheet is attached to the encapsulant. An edge seal may also be formed along the edge of the module to prevent water vapor or liquid transmission through the edge into the monolithically integrated module structure.

In standard Si module technologies and for CIGS and amorphous Si cells that are fabricated on conductive substrates such as aluminum or stainless steel foils the solar cells are not deposited or formed on the protective sheet. They are separately manufactured and then the, manufactured solar cells are electrically interconnected by stringing them or shingling them to form solar cell strings. In shingling, individual cells are placed in a staggered manner so that a bottom surface of one cell makes direct physical and electrical contact to a top surface of an adjacent cell. Therefore, there is no gap between two shingled cells. Stringing is typically done by placing the cells side by side with a small gap between them and using conductive wires or ribbons that connect an electrical terminal of one cell to an electrical terminal of an adjacent cell. Strings obtained by stringing or shingling are then interconnected to form circuits. Circuits may then be packaged in protective packages to form modules. Each module typically includes a plurality of strings of solar cells which are electrically connected to one another. The solar modules are constructed using various packaging materials to mechanically support and protect the solar cells in them against mechanical damage. The most common packaging technology involves lamination of circuits in transparent encapsulants. In a lamination process, in general, the electrically interconnected solar cells are covered with a transparent and flexible encapsulant layer which fills any hollow space among the cells and tightly seals them into a module structure, preferably covering both of their surfaces. A variety of materials are used as encapsulants, for packaging solar cell modules, such as ethylene vinyl acetate copolymer (EVA) and thermoplastic polyurethanes (TPU). However, in general, such encapsulant materials are moisture permeable; therefore, they must be further sealed from the environment by a protective shell, which forms a barrier to moisture transmission into the module package. The protective shell generally includes a front protective sheet, a back protective sheet and an edge sealant that is at the periphery of the module structure (see for example, published application WO/2003/050891, "Sealed Thin Film PV Modules"). The top protective sheet is typically glass, but may also be a transparent flexible polymer film such as TEFZEL® (a product of DuPont), polyethylene terephthalate (PET), polyethylene naphthalate (PEN), and the like. The top polymeric film may have a moisture barrier coating on it. The back protective sheet may be a sheet of glass or a polymeric sheet such as TEDLAR® (a product of DuPont). The back protective polymeric sheet may also have a moisture barrier layer in its structure such as a metallic film like an aluminum film. Light enters the module through the front protective sheet. The edge sealant is a moisture barrier material that may be in the form of a viscous fluid which may be dispensed from a nozzle to the peripheral edge of the module structure or it may be in the form of a tape which may be applied to the peripheral edge of the module structure. There are a variety of such edge sealants provided to solar module manufacturers. It should be appreciated that in the above described non-monolithic module structure where separate pieces of solar cells are interconnected and then encapsulated on both surfaces by an encapsulant, the encapsulant becomes a conduit through which moisture may travel to all regions of the solar cell, front and back.

FIG. 2A shows a prior art solar module 50 including a first string 52A of solar cells and a second string 52B of solar cells. The first string 52A includes solar cells A1, A2 and A3, the second string 52B includes solar cells B1, B2 and B3. The solar cells in each string are electrically interconnected with one another. The strings 52A and 52B are also electrically connected with one another. The interconnections between cells and strings are not shown in the figure to simplify the drawing. As shown in FIG. 2B in cross section, the solar cells are encapsulated by encapsulant material 54 and sandwiched between a top or front protective sheet 56, typically glass, through which the light enters and a back protective sheet 58, and a bottom or back protective sheet 58, which may be glass or a polymeric sheet. An edge sealant 60 seals the edges of the protective sheets. The protective sheets and the edge sealant 60 form a protective shell of the solar module 50, which protects the solar cells encapsulated by the encapsulant material from outside conditions such as moisture. Although the exemplary prior art solar module design shown in FIG. 2A has six solar cells, many more electrically connected solar cells can be packed into the protective shell. However, one disadvantage associated with this design is the fact that any defect in the protective shell that causes moisture to get inside the module structure causes complete failure of the whole module. Once moisture gets into the protective shell it diffuses fast through the encapsulant material which is a poor moisture barrier. Such moisture diffusion through substantially the whole inside volume of the protective shell results in corrosion and malfunction of the entire solar cell population within the protective shell. Defects in the protective shell may occur in the edge sealant or in the front or back protective sheets. For the newly developed flexible module structures such as flexible modules employing flexible CIGS or amorphous Si solar cells fabricated on metal foil substrates, this concern of defectivity is even more important compared to the module structures employing glass protective sheets. Since the flexible module structures employ thin polymeric materials as the front and back protective sheets, preferably with moisture barrier coatings or layers, any defects in the polymeric sheets and/or the moisture barrier coatings or layers would cause moisture to enter the module structure through the front or back protective sheets and cause failure as described above. Since the total area of the front and back protective sheets is much larger than the cross sectional area of the edge sealant through which moisture may enter, the probability of defect formation in the large area front and back protective sheets is high in flexible and large module structures.

From the foregoing, there is a need in the solar cell manufacturing industry, especially in thin film photovoltaics, for better packaging techniques that can provide reliable performance at reduced cost. For example, CIGS solar cells are being developed for their low cost and high efficiency. However, the long term reliability of CIGS modules depends on the ability of the module package to keep the moisture away from the solar cells for over 20 years. It should be noted that CIGS solar cells are sensitive to moisture and they need to be protected, especially in non-monolithic module structures where individual CIGS cells are interconnected and then encapsulated in an encapsulant.

SUMMARY

The aspects and advantages of the present inventions generally relate to apparatus and methods of photovoltaic or solar module design and fabrication and, more particularly, to packaging techniques for solar modules such as solar modules employing thin film solar cells.

In one aspect, an embodiment provides a photovoltaic module that includes a first protective sheet; a second protective sheet; an edge sealant disposed between the first and second protective sheets and continuously along an edge, the edge sealant, the first protective sheet and the second protective sheet thereby defining a moisture resistant protective shell; at least one solar cell, having a front light receiving side and a back substrate side, disposed within the moisture resistant protective shell; a support material that at least partially encapsulates the at least one solar cell on both the front light receiving side and the back substrate side of the solar cell; and a divider sealant disposed between the first and second protective sheets and within the moisture resistant protective shell, wherein the divider sealant divides the moisture resistant protective shell into at least two moisture resistant sealed sections, and wherein the edge sealant and the divider sealant are resistive to moisture transmission, and wherein the edge sealant and the divider sealant are made from material and constructed so that a water vapor transmission rate through each of the edge sealant and the divider sealant is less than 0.001 g/m$^2$/day.

In another aspect, an embodiment provides a method of manufacturing a solar cell module that includes disposing at least one solar cell over a first protective sheet, the at least one solar cell including a front light receiving side and a back substrate side; disposing an edge sealant along the edges of the first protective sheet, thereby forming a cavity holding the at least one solar cell; at least partially covering the at least one solar cell with a support material on both the front light receiving side and the back substrate side of the solar cell; disposing a divider sealant to divide the cavity into at least two cavity sections; and placing a second protective sheet over the support material, the edge sealant and the divider sealant to enclose the at least two cavity sections, wherein the moisture transmission rate through the edge sealant and the divider sealant is less than 0.001 g/m²/day.

These and other aspects and advantages are described further herein.

DETAILED DESCRIPTION OF THE PREFERRED EMBODIMENTS

The preferred embodiments described herein provide methods of manufacturing solar cell modules that include a protective shell having two or more sealed sections. Each sealed section is isolated from the adjacent section by a sealant that is a moisture barrier. Each section includes a cell unit. Each cell unit comprises at least one solar cell or a portion of a solar cell. If more than one solar cell is included in a cell unit, the cell unit may be called a string. Each sealed section may contain one or more strings having a plurality of solar cells. The solar cells in each string are electrically interconnected. Light receiving front surface of the solar cells are configured to form a front side of each string while the substrates of the solar cells are configured to form a back side of each string. A support material or encapsulant such as EVA may cover at least one of a front side and the back side of each cell or cell string. The support material may be used to fully encapsulate each solar cell and each string, top and bottom.

In one embodiment, the protective shell comprises top and bottom protective sheets, and an edge sealant to seal the edges at the perimeter of the protective sheets, and one or more divider sealants to divide the interior volume or space of the protective shell into sections, each section comprising at least a portion of a solar cell and an encapsulant encapsulating the front and back surfaces of the portion. The edge and divider sealants are disposed between the top and the bottom protective sheets. In this sectioned module configuration, any local defect through the protective shell will affect the solar cell(s) or solar cell portions within a particular section that may be in contact with this defect and will not affect the solar cell(s) or solar cell portions that are in other sections which are separated from the particular section by the divider sealants. Therefore, the solar cells or solar cell portions in the sections that are not affected by the defect will continue functioning and producing power.

Figure 1:
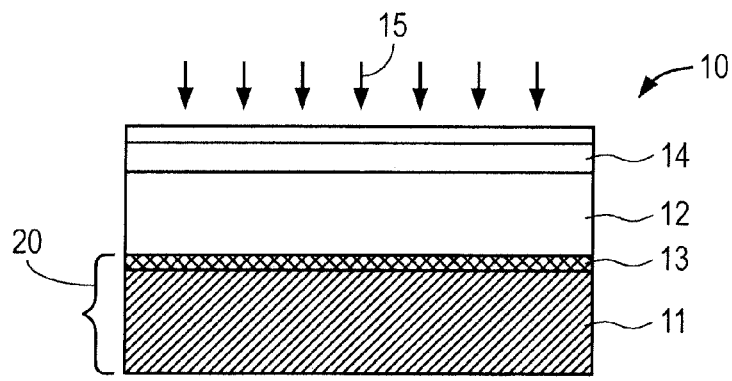
FIG. 1 is a schematic view a solar cell.
Figure 2A:
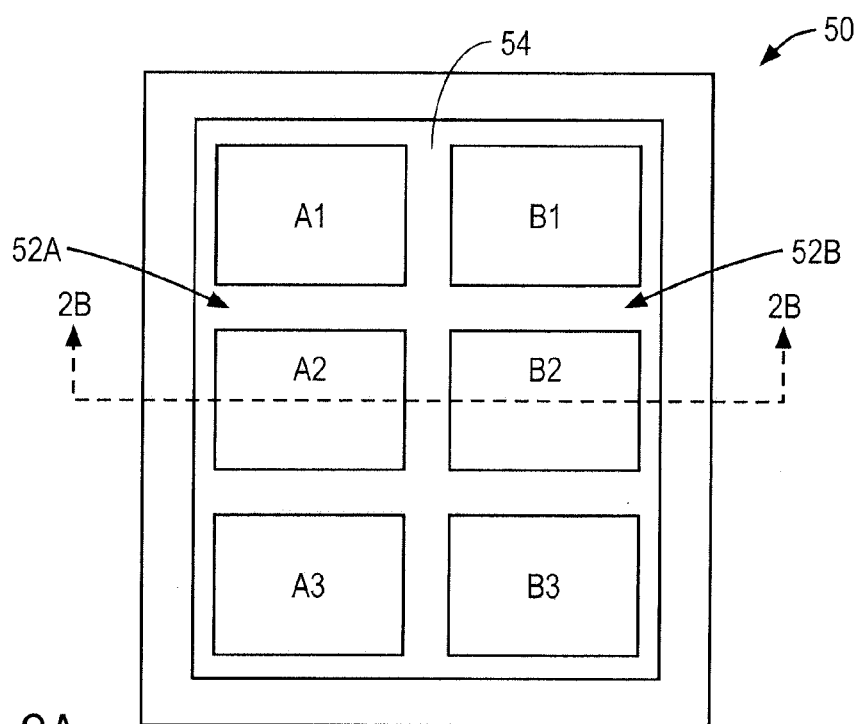
FIG. 2A is a schematic view of a prior art solar cell module.
Figure 2B:
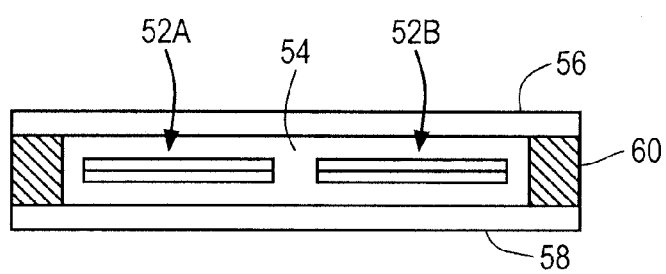
FIG. 2B is a schematic cross sectional view of the solar cell module shown in FIG. 2A taken along the line 2B-2B.
Figure 3:
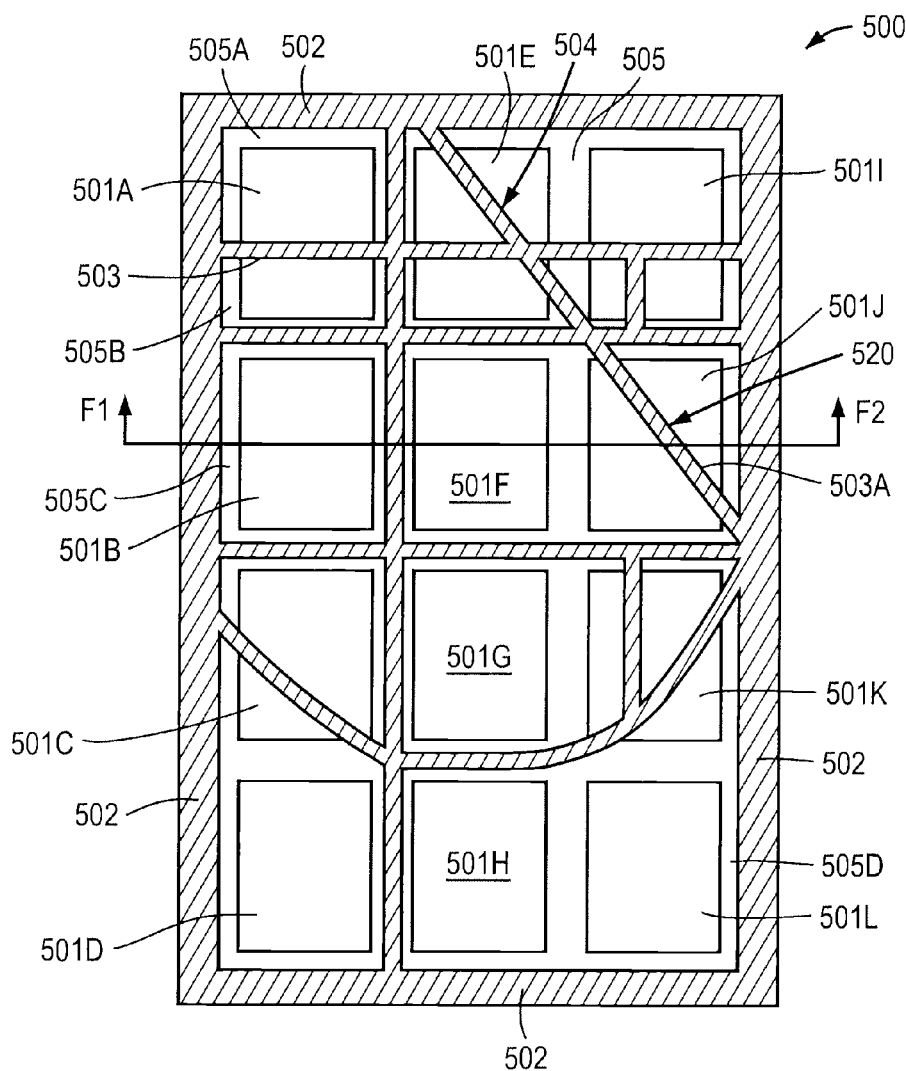
FIG. 3 is a schematic view of a solar cell module according to one embodiment.
Figure 3C:
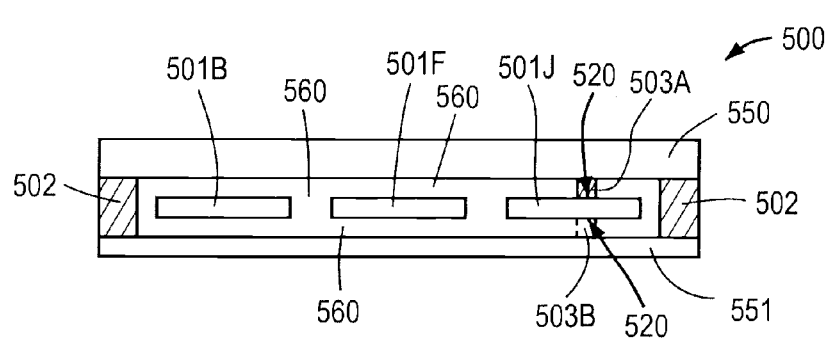
FIG. 3C is a schematic cross sectional view of the solar cell module shown in FIG. 3 taken along the line F1-F2.

FIG. 3 shows a top or front view of a module 500. FIG. 3C shows a cross sectional view along the line F1-F2. It should be noted that the module 500 may not be the exact design of a module that one may manufacture. Rather, it is exemplary and demonstrative and is drawn for the purpose of demonstrating or showing various aspects of the present inventions in a general way in a single module structure.

The exemplary module 500 comprises twelve solar cells that are labeled as 501A, 501B, 501C, 501D, 501E, 501F, 501G, 501H, 501I, 501J, 501K, and 501L. These solar cells are electrically interconnected. The interconnections are not shown in the figure to simplify the drawing. In FIG. 3 there are gaps between the solar cells. However, as explained before, it is possible that these solar cells may be shingled and therefore, there may not be gaps between them. Cells may also be shaped differently. For example, they may be elongated with one dimension being 2-100 times larger than the other dimension. The module 500 has a top protective sheet 550 and a bottom protective sheet 551 and an edge sealant 502 between the top protective sheet 550 and the bottom protective sheet 551. The edge sealant 502 is placed at the edge of the module structure and is rectangular in shape in this example. For other module structures with different shapes, the edge sealant may also be shaped differently, following the circumference of the different shape modules. The top protective sheet 550, the bottom protective sheet 551 and the edge sealant 502 forms a protective shell.

The module 500 further comprises divider sealants 503 that are formed within the protective shell, i.e. within the volume or space created by the top protective sheet 550, the bottom protective sheet 551 and the edge sealant 502. The divider sealants 503 form a sealant pattern 504 that divides the protective shell into sealed sections 505. There are fifteen sections 505 in the exemplary module of FIG. 3. Some of the sections 505 in the middle region of the module 500 are bordered by only the divider sealants 503. Sections close to the edge of the module 500, on the other hand are bordered by divider sealants 503 as well as portions of the edge sealant 502. As can be seen from FIG. 3, each section may contain a solar cell, a portion of a solar cell, portions of more than one solar cell or more than one solar cell. For example, sections labeled as 505A and 505B each contain a different portion of the solar cell 501A, whereas the section labeled as 505C contains the single solar cell 501B. The section labeled as 505D, on the other hand, contains the solar cells 501H and 501L, as well as a portion of the solar cell 501K. The sealant pattern 504 of the divider sealants 503 may be shaped in many different ways, such as rectangular, curved, circular, etc. Portions of the divider sealants 503 may be placed in the gap between the solar cells, on the solar cells and even under the solar cells. If the divider sealants 503 or their portions are placed on the solar cells, it is preferable that they are lined up with the busbars (not shown in the figure to simplify the drawing) of the solar cells so that any possible extra shadowing of the cells by the divider sealants 503 is avoided.

As shown in FIGS. 3 and 3C, the portions of the divider sealants may be placed on divider sealant spaces 520 on the solar cells. The divider sealant spaces 520 are designated locations on the front surface or the back surface of the solar cells. The divider sealant spaces 520 do not contain any support material so that the divider sealant can be attached to the front or back side of the solar cell. It should be noted that busbars on solar cells already shadow the cell portions right under them and therefore, placing the divider sealants 503 over the busbars would not cause additional loss of area in the devices. As can be seen in the cross sectional view of the module 500 in FIG. 3C a portion 503A of the sealant pattern 504 is placed over the solar cell 501J. Another sealant portion 503B may also be present under the solar cell 501J. In other words, a bottom sealant pattern (not shown) may be employed under the solar cells. The bottom sealant pattern may or may not match the shape of the sealant pattern 504. The solar cells in the module 500 are encapsulated within an encapsulant 560 that surrounds and supports them. After this general description of a general module structure employing various teachings of the present inventions, more simplified module structures will now be described to explain its unique features and benefits.

Figure 3A:
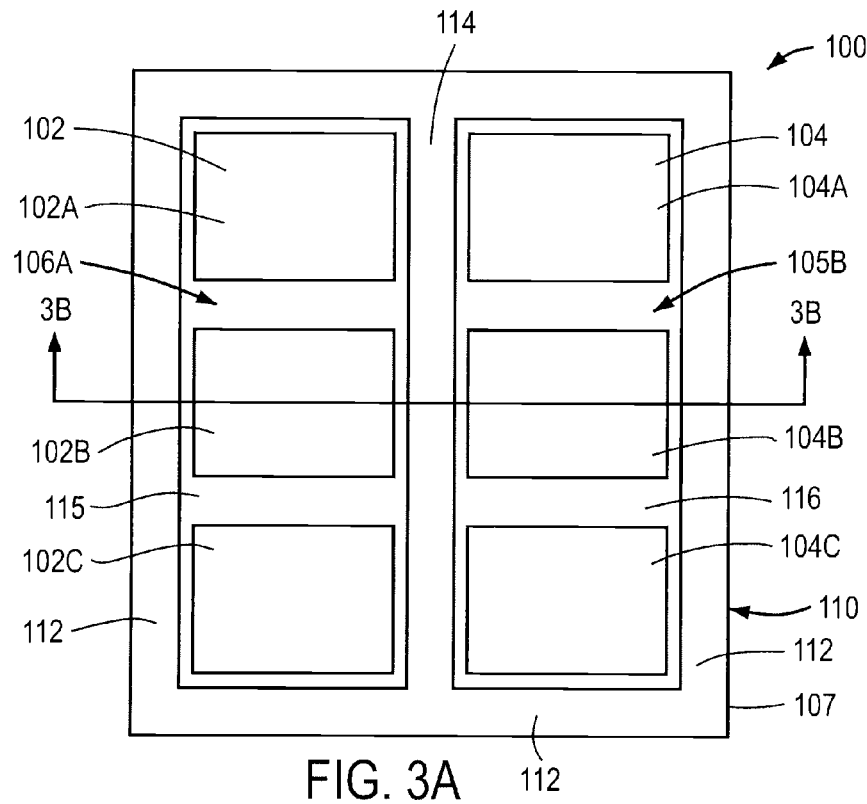
FIG. 3A is a schematic view of an embodiment of a solar cell module.
Figure 3B:
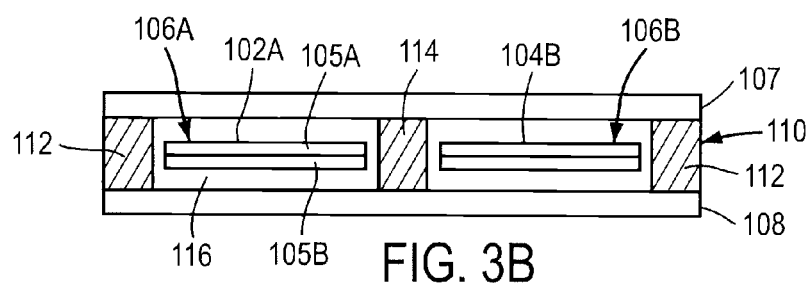
FIG. 3B is a schematic cross sectional view of the solar cell module shown in FIG. 3A taken along the line 3B-3B.

FIGS. 3A and 3B show a solar cell module 100 including at least two solar cell units, a first solar cell unit 102 and a second solar cell unit 104. The units 102 and 104 may be strings of solar cells. The unit 102 may include solar cells 102A, 102B and 102C, and the unit 104 may include solar cells 104A, 104B and 104C. Each solar cell includes a light receiving front portion 105A and a back portion 105B or base. The light receiving front portions of the solar cells form the front side of the solar cell units 102 and 104, while the back portions form the back side of the solar cell units. Solar cells in each unit or string are electrically interconnected to one another using conductive interconnects (not shown for clarity) by utilizing processes, such as soldering or gluing, that are well known in the field. As shown in FIGS. 3A-3B the module 100 has a multi-section structure with a first section 106A and a second section 106B. The first section 106A includes the first string 102 and the second section 106B includes the second string 104. The sections are formed between a top protective sheet 107 and a back protective sheet 108 of the module 100. A first sealant 112 or an edge sealant seals the edges of the protective sheets at their perimeter thereby forming a protective shell 110. A second sealant 114 or a divider sealant separates the strings 102 and 104 thereby forming the sections 106A and 106B. Both the edge sealant 112 and the divider sealant are disposed between and attached to the front and back protective sheets 107 and 108 as in the manner shown in FIGS. 3A and 3B. The edge and the divider sealants may be two parts of a single piece sealant.

In this embodiment, each solar cell string is encapsulated with a support material layer 116. The support material 116 such as EVA may fully fill the sections 106A and 106B which are sealed by the edge sealant 112 and the divider sealant 114 and the first and second protective sheets 107 and 108. Separately sealed sections independently protect the solar cell strings encapsulated within them by the support material 116. This provides extra protection to the solar cell strings. For example, even if a defect in the edge sealant 112 near the first section 106A allows moisture to leak into the first section 106A and causes malfunction of the first string 102, the second string 104 in the second section 106B, which is sealed, can still function and produce power. It should be noted that as the number of individually sealed sections within a module structure increases, probability of solar cell failure due to a defect in the protective shell decreases. The defects may be in the edge sealant or even in either one of the front protective sheet and the back protective sheet. If a defect in the protective shell brings moisture into a sealed section, the moisture gets trapped in that sealed section without ability to diffuse through the rest of the module structure. The solar cell module 100 of FIG. 3A may, for example, have six sections instead of the two that is shown. In this case, each of the solar cells 102A, 102B, 102C, 104A, 104B and 104C may be in a section of its own.

Figure 7:
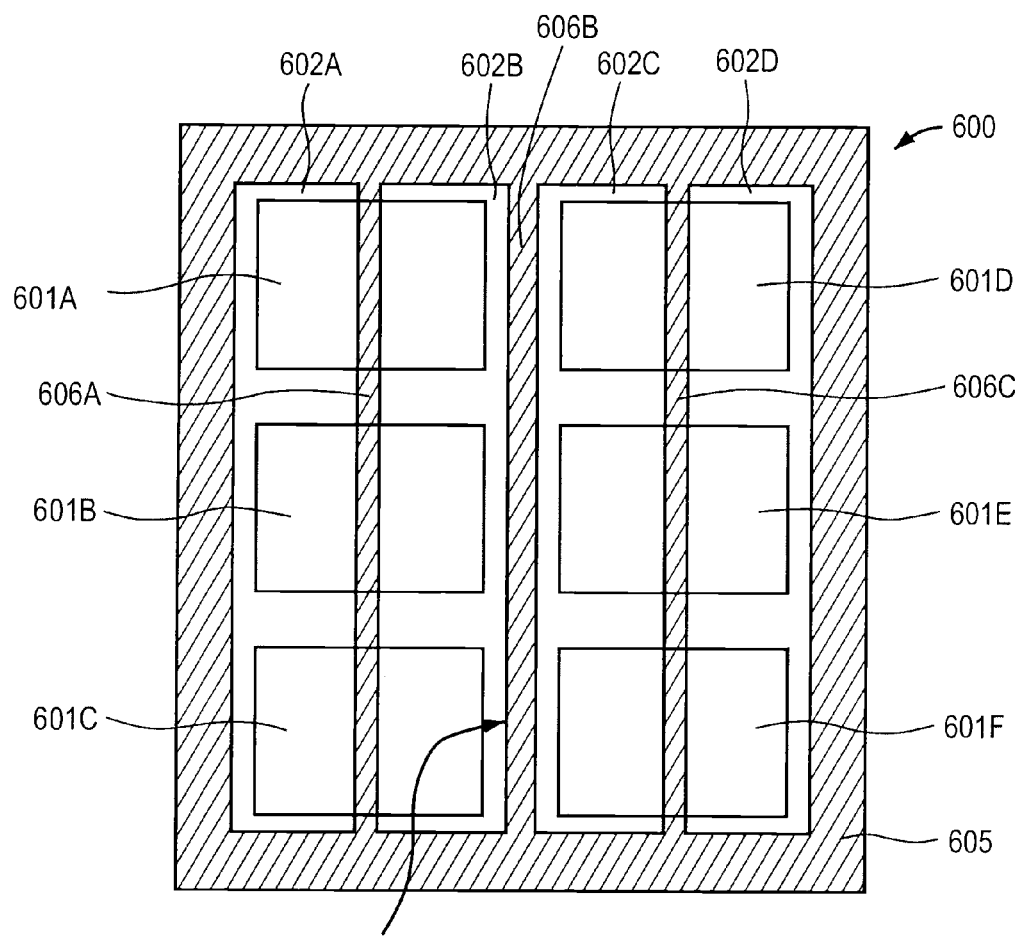
FIG. 7 is a module design.
Figure 7A:
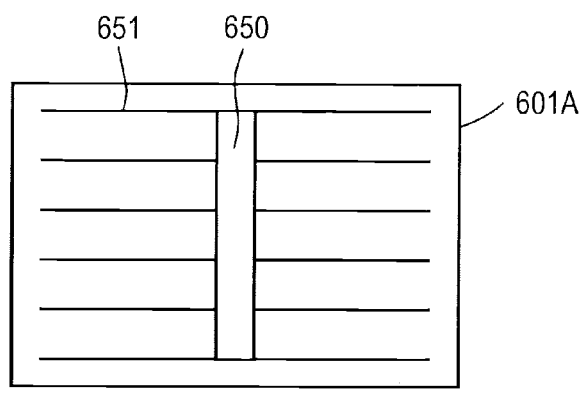
FIG. 7A is a solar cell used in the module design of FIG. 7.

A four section module design is shown in FIG. 7. The module 600 of FIG. 7 comprises six cells, 601A, 601B, 601C, 601D, 601E, and 601F, all of which may be similar in design. The solar cell design is shown in FIG. 7A. The solar cell 601A comprises a busbar 650 and fingers 651. These design details of the solar cells are not shown in FIG. 7 to simplify the drawing. The module 600 has a four-section structure, each of the four sections 602A, 602B, 602C and 602D containing one half portion of three cells. For example, section 602A contains a portion of cell 601A, a portion of cell 601B and a portion of cell 601C. Sections 602A, 602B, 602C and 602D are formed by the edge sealant 605 and the divider sealants 606 which comprises three divider sealant portions 606A, 606B and 606C. The divider sealant portions 606A and 606C are substantially aligned with the busbars 650 of the solar cells 601A, 601B, 601C, 601D, 601E, and 601F, so that shadowing losses due to the divider sealant portions 606A, 606B and 606C are minimized.

As depicted in FIG. 3 and FIG. 7, there is merit for forming sealed sections in the module structure where each section contains only a portion of a solar cell. This way, if moisture or other vapors enter into a section and damages a portion of a solar cell, other portions of the solar cell contained in other sections that are not affected by the moisture would continue producing power efficiently. This way, the overall performance of the module structure would be enhanced compared to a module without the sections. The edge sealant and divider sealants are materials that are highly resistive to moisture penetration. The water vapor transmission rate of the edge and divider sealants is preferably below 0.001 $g/m^2/day$, more preferably below 0.0001 $g/m^2/day$.

A method of manufacturing an embodiment of the solar module 100 will be described in connection to FIG. 4. Initially, a pair of front support layers 116A is placed on an inner surface 107B of the front protective sheet 107 which is pre-cleaned. Sealant spaces 118 are left between the edge of the protective sheet 107 and between the front support layers 116A to accommodate the edge sealant and the divider sealant described above. In the following step, the front portion 105A of the solar cell strings 102 and 104 may be placed on the front support layers 116A. Then, the back support layers 116B are placed on the back sides 105B of the solar cell strings 102 and 104. The edge sealant 112 and the divider sealant 114 are attached to the sealant spaces 118. Finally, an inner surface 108B of the back protective sheet 108 is placed over the back support layers 116B and over the edge and divider sealants. The front protective sheet 107 is typically a glass, but may also be a transparent flexible polymer film such as TEFZEL®, or another polymeric film with moisture barrier coatings. TEDLAR® and TEFZEL® are brand names of fluoropolymer materials from DuPont. TEDLAR® is polyvinyl fluoride (PVF), and TEFZEL® is ethylene tetrafluoroethylene (ETFE) fluoropolymer. The back protective sheet 108 may be a sheet of glass or a polymeric sheet such as TEDLAR®, or another polymeric material which may or may not be transparent. The back protective sheet 108 may comprise stacked sheets comprising various material combinations such as metallic films as moisture barrier. The front and back support layer materials may preferably include EVA or thermoplastic polyurethane (TPU) material or both. It should be noted that the thicknesses of the components shown in the figures are not to scale. The module 100 may have a rectangular or any other geometrical shape, and thus the size of the sections and the distribution of the solar cell strings may be arranged accordingly. It is also possible that either one or both of the front support layer and the back support layer may be eliminated from the module structures.

Figure 4:
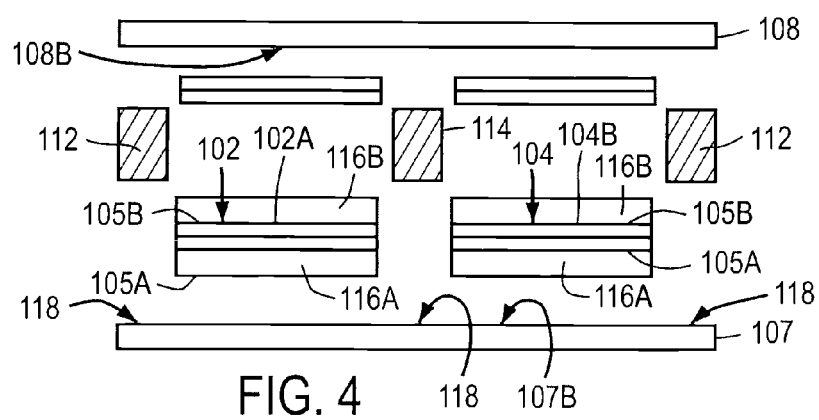
FIG. 4 is a schematic view showing the components of the solar cell module during manufacturing.

The stacked components of the solar cell module depicted in FIG. 4 are placed in a laminator and heat treated for about 10-20 minutes in a temperature range of 120°-160° C. under pressure. This can alternatively be achieved through roll-to-roll lamination. As shown in FIGS. 3B and 4, each solar cell includes a front portion and a back portion or base. The base 105B includes a substrate and a contact layer formed on the substrate. A preferred substrate material may be a metallic material such as stainless steel, aluminum or the like. An exemplary contact layer material may be molybdenum. The front portion 105A may include an absorber layer, such as a CIGS absorber layer which is formed on the contact layer, and a transparent layer, such as a buffer-layer/ZnO stack, formed on the absorber layer. An exemplary buffer layer may be a (Cd,Zn)S layer. Conductive fingers (not shown) may be formed over the transparent layer. Each interconnect electrically connects the substrate or the contact layer of one of the cells to the transparent layer of the next cell. However, the solar cells may be interconnected using any other method known in the field.

Figure 5:
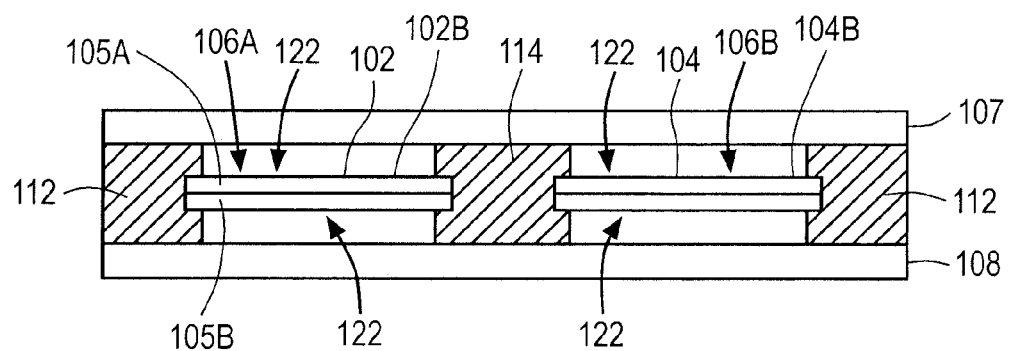
FIGS. 5 and 6 are schematic views of various embodiments of the solar cell module.

FIG. 5 shows another embodiment of the module 100 in side view. In this embodiment, the strings 102 and 104 are supported by the edge and divider sealants 112 and 114. Gaps 122 are left between the back side of the strings and the back protective sheet 108 and between the front side of the strings and the front protective sheet 107. Within the sections 106A and 106B, the edges of the strings 102 and 104 are held in place and sealed by the edge and divider sealants 112 and 114 as in the manner shown in FIG. 5. It is possible to fill any of the gaps 122 with a support layer (not shown) identified as support layer 116A or 116B in FIG. 4.

Figure 6:
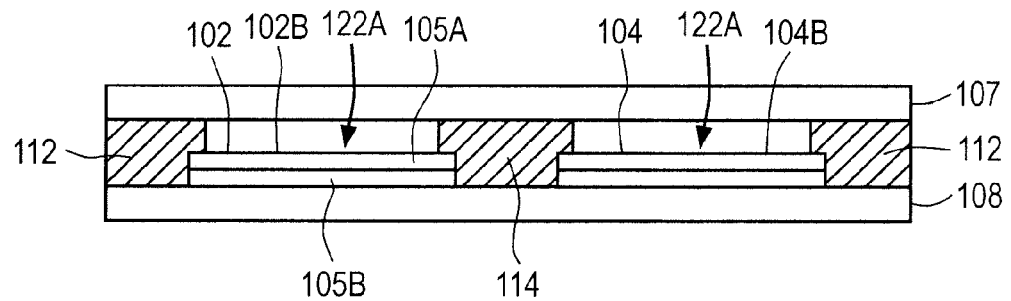

FIG. 6 shows yet another embodiment of the module 100 in side view. In this embodiment, a gap 122A is present over the front side of the strings 102 and 104. The gap 122A may optionally be filled with a front support layer (not shown but similar to the front support layer 116A of FIG. 4). The back sides of the strings 102 and 104 are placed on the back sheet 108. The edges of the strings 102 and 104 are held in place and sealed by the edge and the divider sealants 112 and 114 as in the manner shown in FIG. 6.

Although aspects and advantages of the present inventions are described herein with respect to certain preferred embodiments, modifications of the preferred embodiments will be apparent to those skilled in the art.

I claim:

1. A photovoltaic module comprising:
a first protective sheet;
a second protective sheet;
an edge sealant disposed between the first and second protective sheets and continuously along an edge, the edge sealant, the first protective sheet and the second protective sheet thereby defining a moisture resistant protective shell;
at least one solar cell, having a front light receiving side, a back substrate side, and a bus bar that is disposed on the front light receiving side to create at least two front light receiving side portions, each front light receiving side portion on opposite sides of the bus bar, the at least solar cell being disposed within the moisture resistant protective shell;
a support material that at least partially encapsulates the at least one solar cell on both the front light receiving side and the back substrate side of the solar cell; and
a divider sealant disposed between the first and second protective sheets and within the moisture resistant protective shell, wherein the divider sealant divides the moisture resistant protective shell into at least two moisture resistant sealed sections, each of the two front light receiving side portions being disposed in a different one of the two moisture resistant sealed sections, such that the divider sealant is aligned with the bus bar of the at least one solar cell and wherein the edge sealant and the divider sealant are resistive to moisture transmission, and wherein the edge sealant and the divider sealant are made from material and constructed so that a water vapor transmission rate through each of the edge sealant and the divider sealant is less than 0.001 $g/m^2/day$.

2. The photovoltaic module of claim 1, wherein the at least one solar cell includes the at least one solar cell as a first solar cell and also a second solar cell that is electrically interconnected to the first solar cell, each of the first solar cell and the second solar cell having a respective first and second front light receiving side, a respective first and second back substrate side, and a respective first and second bus bar that is disposed on the respective first and second front light receiving side that creates the two front light receiving side portions on each of the first and second solar cells, each of the first solar cell and the second solar cell being disposed within the moisture resistant protective shell.

3. The photovoltaic module of claim 2, wherein the support material includes a first support material that encapsulates the first solar cell forming a first encapsulated solar cell, and a second support material that encapsulates the second solar cell thereby forming a second encapsulated solar cell.

4. The photovoltaic module of claim 2, wherein a divider sealant space is located on at least one of the first solar cell and the second solar cell, the divider sealant space being along a path that is different from the first busbar and the second busbar, thereby creating at least one additional moisture sealed section.

5. The photovoltaic module of claim 4, wherein the support material encapsulates the first solar cell and the second solar cell and wherein the divider sealant space is free of and excludes the support material.

6. The photovoltaic module of claim 5, wherein a further portion of the divider sealant is disposed on the divider sealant space located on at least one of the first and second solar cells.

7. The photovoltaic module of claim 2, wherein the at least two moisture resistant sealed sections each contain one of one of the two front light receiving side portions from each of the first solar cell and the second solar cell.

8. The photovoltaic module of Claim 7, wherein the divider sealant is aligned with the first busbar and the second busbar of the respective first and second solar cells.

9. The photovoltaic module of claim 1, wherein the support material is a transparent polymeric material.

10. The photovoltaic module of claim 1, wherein the first protective sheet includes one of a moisture barrier flexible polymeric film and glass.

11. The photovoltaic module of claim 10, wherein the second protective sheet includes one of a moisture barrier flexible polymeric film and glass.

12. The photovoltaic module of claim 1, wherein the solar cells are Group IBIIIAVIA thin film solar cells with stainless steel substrate.

13. The photovoltaic module of claim 12 wherein the front protective sheet is a transparent moisture barrier flexible polymer film and the back protective sheet is a moisture barrier flexible polymer film.

14. The photovoltaic module of claim 8, wherein a divider sealant space is located on at least one of the first solar cell and the second solar cell, the divider sealant space being along a path that is different from the first busbar and the second busbar.

15. The photovoltaic module of claim 14, wherein the support material encapsulates the first solar cell and the second solar cell and wherein the divider sealant space is free of and excludes the support material.

16. The photovoltaic module of claim 15, wherein a further portion of the divider sealant is disposed on the divider sealant space located on at least one of the first and second solar cells, thereby creating at least one additional moisture sealed section.

* * * * *